United States Patent
Kim et al.

(10) Patent No.: US 11,455,927 B2
(45) Date of Patent: Sep. 27, 2022

(54) DATA PROCESSING DEVICE, DATA DRIVING DEVICE AND SYSTEM FOR DRIVING DISPLAY DEVICE

(71) Applicant: SILICON WORKS CO., LTD., Daejeon (KR)

(72) Inventors: Do Seok Kim, Daejeon (KR); Yong Hwan Mun, Daejeon (KR); Myung Yu Kim, Daejeon (KR); Hyun Pyo Cho, Daejeon (KR)

(73) Assignee: SILICON WORKS CO., LTD., Daejeon (KR)

( * ) Notice: Subject to any disclaimer, the term of this patent is extended or adjusted under 35 U.S.C. 154(b) by 0 days.

(21) Appl. No.: 17/021,768

(22) Filed: Sep. 15, 2020

(65) Prior Publication Data

US 2021/0280110 A1  Sep. 9, 2021

(30) Foreign Application Priority Data

Mar. 3, 2020   (KR) .................. 10-2020-0026473
Jul. 13, 2020   (KR) .................. 10-2020-0086030

(51) Int. Cl.
G09G 3/20   (2006.01)
H03L 7/08   (2006.01)

(52) U.S. Cl.
CPC ....... *G09G 3/20* (2013.01); *G09G 2300/0452* (2013.01); *G09G 2300/08* (2013.01); *G09G 2310/0267* (2013.01); *G09G 2310/0275* (2013.01); *G09G 2310/08* (2013.01); *G09G 2320/0252* (2013.01); *G09G 2370/00* (2013.01); *H03L 7/0807* (2013.01)

(58) Field of Classification Search
CPC ................. G09G 2310/08; G09G 2370/00–47
See application file for complete search history.

(56) References Cited

U.S. PATENT DOCUMENTS

| | | | |
|---|---|---|---|
| 8,755,480 B1* | 6/2014 | Leong | H03L 7/0812 375/376 |
| 9,508,321 B2 | 11/2016 | Oh et al. | |
| 10,074,340 B2* | 9/2018 | Matsuda | G09G 5/006 |
| 10,354,587 B2 | 7/2019 | Kim et al. | |
| 2008/0297213 A1* | 12/2008 | Abbasfar | H04L 7/0008 327/156 |
| 2010/0266080 A1* | 10/2010 | Akita | G09G 5/008 375/362 |
| 2016/0013957 A1* | 1/2016 | Lee | H04L 7/0331 375/238 |
| 2018/0321705 A1* | 11/2018 | Koshisaka | H04L 25/00 |
| 2019/0199508 A1* | 6/2019 | Shinoda | H03L 7/22 |
| 2021/0020136 A1* | 1/2021 | Zhao | G09G 3/36 |

FOREIGN PATENT DOCUMENTS

KR   10-1121958 B1   3/2012

* cited by examiner

*Primary Examiner* — William Boddie
*Assistant Examiner* — Bipin Gyawali
(74) *Attorney, Agent, or Firm* — Fenwick & West LLP

(57) ABSTRACT

The present disclosure relates to a data processing device, a data driving device, and a system for driving a display device, and more particularly, to a data processing device, a data driving device, and a system for speeding up data communication in a display device.

19 Claims, 9 Drawing Sheets

DATA PROCESSING DEVICE, DATA DRIVING DEVICE AND SYSTEM FOR DRIVING DISPLAY DEVICE

CROSS REFERENCE TO RELATED APPLICATION

This application claims priority from Republic of Korea Patent Applications No. 10-2020-0026473 filed on Mar. 3, 2020 and Republic of Korea Patent Application No. 10-2020-0086030 filed on Jul. 13, 2020, each of which are hereby incorporated by reference in its entirety.

BACKGROUND

1. Field of Technology

The present disclosure relates to a technology for driving a display device.

2. Description of the Prior Art

On a display panel, a plurality of pixels arranged in a form of a matrix are disposed and each pixel comprises red (R), green (G), and blue (B) sub-pixels. Each sub-pixel emits light according to a greyscale value obtained from image data to display an image on the display panel.

Image data is transmitted from a data processing device, referred to as a timing controller, to a data driving device, referred to as a source driver Image data is transmitted in a form of a digital signal and the data driving device converts image data received in a form of a digital signal into an analog voltage to drive each pixel.

Since each piece of image data indicates a greyscale value of each pixel, the amount of image data increases as the number of pixels disposed on a display panel increases. Additionally, the amount of image data to be transmitted within a unit time increases as a frame rate increases.

Recently, there is a tendency that, as a display panel has a higher resolution, both the number of pixels disposed on a display panel and the frame rate increase. In order to process the increased amount of image data, data communication in a display device is required to be speeded up.

SUMMARY

An aspect of the present disclosure is to provide a technology for speeding up data communication in a display device.

To this end, in an aspect, the present disclosure provides a data driving device comprising: a low-speed communication circuit to perform low-speed clock training, using a low-speed communication clock signal received from a data processing device in a low-speed communication mode, and to output a first level of a low-speed communication status signal after completing the low-speed clock training; a high-speed communication circuit to perform high-speed clock training, using a high-speed communication clock signal received from the data processing device in a clock training section in a high-speed communication mode, and to output a high-speed communication status signal after adjusting its level according to a result of the high-speed clock training; and a lock control circuit to generate a lock signal according to the low-speed communication status signal and the high-speed communication status signal to transmit it to the data processing device and to maintain the level of the lock signal from the end of the low-speed communication mode to the clock training section in the high-speed communication mode.

The lock control circuit may transmit a second level of the lock signal before the low-speed communication circuit completes the low-speed clock training, change the level of the lock signal into a first level to transmit it to the data processing device when the low-speed communication status signal, received from the low-speed communication circuit, is at a first level, and transmit the lock signal fixed at the first level from the end of the low-speed communication mode to the clock training section.

The lock control circuit may generate the lock signal according to the low-speed communication status signal in the low-speed communication mode and according to the high-speed communication status signal after the clock training section in the high-speed communication mode.

The high-speed communication circuit may comprise a clock recovery circuit and an equalizer. The high-speed communication circuit may perform high-speed clock training in the clock recovery circuit, and then, output the high-speed communication status signal to the lock control circuit.

In an equalizer tuning section before the clock training section, the clock recovery circuit may repeatedly perform a clock initialization and high-speed clock training for equalizer tuning multiple times. Here, the clock recovery circuit may output the second level of the high-speed communication status signal during the clock initialization and output the first level of the high-speed communication status signal when the high-speed clock training is completed.

In the equalizer tuning section, the lock control circuit may transmit the lock signal, fixed at the first level regardless of the change of the level of the high-speed communication status signal received from the clock recovery circuit, to the data processing device.

The clock recovery circuit may comprise an oscillator. In a clock recovery tuning section before the clock training section, the clock recovery circuit may change a set value for the oscillator every predetermined time while performing high-speed clock training, output the first level of the high-speed communication status signal when the high-speed clock training is completed, and output the second level of the high-speed communication status signal when the high-speed clock training is not completed.

The lock control circuit may transmit the lock signal, fixed at the first level regardless of the change of the level of the high-speed communication status signal received from the clock recovery circuit, to the data processing device.

The oscillator may be one of a current-controlled oscillator and a voltage-controlled oscillator and the set value may comprise a current value of a reference current inputted to the current-controlled oscillator or a voltage value of a reference voltage inputted to the voltage-controlled oscillator.

In the low-speed communication mode, in a case when there is any abnormality in a low-speed communication with the data processing device after the low-speed communication circuit has outputted the first level of the low-speed communication status signal, the low-speed communication circuit may change the low-speed communication status signal from the first level into the second level and output the signal, and the lock control circuit may change the lock signal into the second level and transmit it to the data processing device.

When the high-speed communication status signal, inputted into the lock control signal right after the clock training section, is in the first level, the lock control circuit may maintain the lock signal at the first level, and when the high-speed communication status signal, inputted into the lock control circuit right after the clock training section, is in the second level, the lock control circuit may change the lock signal into the second level and transmit it to the data processing device.

In another aspect, the present disclosure provides a data processing device comprising: a lock monitoring circuit to receive a lock signal from a data driving device and to check the level of the lock signal; a transmitting circuit to transmit a low-speed communication clock signal and a setup data signal to the data driving device in a low-speed communication mode, and then, to transmit a high-speed communication clock signal to the data driving device after changing the mode into a high-speed communication mode, wherein the setup data signal comprises data for setting a high-speed communication environment in the data driving device; a control circuit to activate the low-speed communication mode to transmit the low-speed communication clock signal using the transmitting circuit when power is supplied, to transmit the setup data signal using the transmitting circuit after the lock monitoring circuit confirms that the level of the lock signal is changed from the second level into the first level when the transmitting circuit transmits the low-speed communication clock signal, and to activate the high-speed communication mode to transmit the high-speed communication clock signal using the transmitting circuit when the lock monitoring circuit confirms that the level of the lock signal is maintained at the first level.

In the high-speed communication mode, the control circuit may transmit one or more signals, in order to make high-speed clock training repeated in the data driving device, to the data driving device using the transmitting circuit before transmitting the high-speed communication clock signal using the transmitting circuit.

When the lock monitoring circuit confirms that the level of the lock signal is maintained at the first level from the start to the end of the transmission of the one or more signals, the control circuit may transmit the high-speed communication clock signal using the transmitting circuit.

When the lock monitoring circuit confirms that the level of the lock signal is maintained at the first level from a time point when the level of the lock signal is changed into the first level to a time point when the transmitting circuit ends the transmission of the setup data signal, the control circuit may activate the high-speed communication mode, and when the lock monitoring circuit confirms that the level of the lock signal is maintained at the first level until a predetermined amount of time has elapsed from a time point when the high-speed communication mode is activated, the control circuit may transmit the high-speed communication clock signal using the transmitting circuit.

In still another aspect, the present disclosure provides a system comprising: a data processing device to activate a low-speed communication mode to transmit a low-speed communication clock signal and then a setup data signal when power is supplied, wherein the data processing device transmits the setup data signal when receiving a first level of a lock signal while transmitting the low-speed communication clock signal, and to activate a high-speed communication mode to transmit a high-speed communication clock signal when continuously receiving the first level of the lock signal; and a data driving device to receive the low-speed communication clock signal to perform low-speed clock training, to transmit the first level of the lock signal to the data processing device when the low-speed clock training is completed, and to receive the high-speed communication clock signal to perform high-speed clock training, wherein the data driving device continuously transmits the first level of the lock signal to the data processing device from the reception of the setup data signal in the low-speed communication mode to the performance of the high-speed clock training.

The data driving device may comprise a clock recovery circuit and an equalizer, and the data processing device may transmit one or more of a clock recovery circuit tuning signal and an equalizer tuning signal to the data driving device before transmitting the high-speed communication clock signal in the high-speed communication mode.

The clock recovery circuit tuning signal may comprise a high-speed communication clock, and the data driving device may perform high-speed clock training multiple times when tuning the clock recovery circuit using the clock recovery circuit tuning signal. Here, the data driving device may transmit the lock signal, fixed at the first level regardless of the multiple times of high-speed clock trainings, to the data processing device.

The equalizer tuning signal may comprise a high-speed communication clock, and the data driving device may perform high-speed clock training multiple times when tuning the equalizer using the equalizer tuning signal. Here, the data driving device may transmit the lock signal, fixed at the first level regardless of the multiple times of high-speed clock trainings, to the data processing device.

As described above, the present disclosure allows speeding up data communication in a display device. Additionally, the present disclosure improves the accuracy of feedback by simplifying feedback of a low-speed communication.

DETAILED DESCRIPTION

Figure 1:
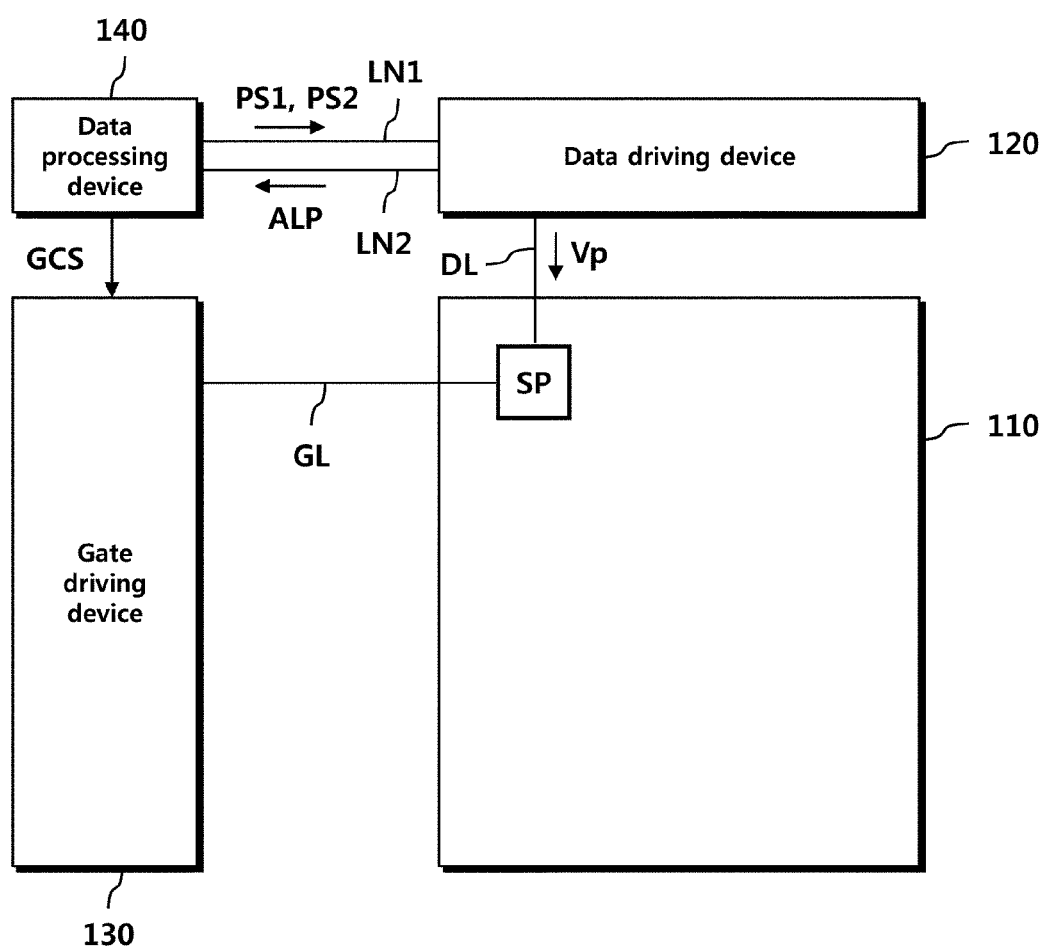
FIG. 1 is a configuration diagram of a display device according to an embodiment.

FIG. 1 is a configuration diagram of a display device according to an embodiment.

Referring to FIG. 1, a display device 100 may comprise a display panel 110, a data driving device 120, a gate driving device 130, and a data processing device 140.

On the display panel 110, a plurality of data lines DL and a plurality of gate lines GL may be disposed and a plurality of pixels may also be disposed. Each pixel may comprise a plurality of sub-pixels SP. Sub-pixels may be red (R), green (G), blue (B), and white (W) sub-pixels. A pixel may comprise RGB sub-pixels SP, RGBG sub-pixels SP, or RGBW sub-pixels SP. For the convenience of description, a case, where a pixel comprises RGB sub-pixels, will be described hereinafter.

The data driving device 120, the gate driving device 130, and the data processing device 140 generate signals for displaying images on the display panel 110.

The gate driving device 130 may supply a turn-on voltage or a turn-off voltage as a gate driving signal through a gate line GL. When a turn-on voltage as a gate driving signal is supplied to a sub-pixel SP, the sub-pixel SP is connected with a data line DL. When a turn-off voltage as a gate driving signal is supplied to the sub-pixel SP, the sub-pixel is disconnected from the data line DL. The gate driving device 130 may be referred to as a gate driver.

The data driving device 120 may supply a data voltage Vp to a sub-pixel through a data line DL. A data voltage Vp supplied through a data line DL may be supplied to a sub-pixel according to a gate driving signal. The data driving device 120 may be referred to as a source driver.

The data driving device 120 may comprise at least one integrated circuit, and this at least one integrated circuit may be connected to a bonding pad of a display panel 110 in a tape automated bonding (TAB) type or a chip-on-glass (COG) type, directly formed on a display panel 110, or integrated on a display panel 110 depending on cases. In addition, a data driving device 120 may be formed in a chip-on-film (COF) type.

The data processing device 140 may supply a control signal to the gate driving device 130 and the data driving device 120. For example, the data processing device 140 may transmit a gate control signal GCS to initiate a scan to the gate driving device 130, output image data to the data driving device 120, and transmit a data control signal to control the data driving device 120 to supply a data voltage Vp to each sub-pixel SP. The data processing device 140 may be referred to as a timing controller.

The data processing device 140 may transmit image data and a data control signal using a first protocol signal PS1 in which a clock is embedded.

The data driving device 120 may transmit a training state of a clock embedded in a first protocol signal PS1 to the data processing device 140 using an auxiliary communication signal ALP.

The data processing device 140 and the data driving device 120 may carry out high-speed data communication using a first protocol signal PS1. High-speed data communication may have a relatively high data loss rate as compared with low-speed data communication. For this reason, the data processing device 140 may transfer data of various setups for the data driving device 120, required for the high-speed data communication, to the data driving device 120 using the low-speed data communication.

In other words, the data processing device 140 transmits setup data for the data driving device 120 to the data driving device 120 using low-speed data communication having a low data loss rate so that the data driving device 120 can precisely receive the setup data.

Setup data for the data driving device 120 may comprise a basic gain level of an equalizer comprised in the data driving device 120, scramble information, line polarity information, or the like. The scramble information may be information about whether the data processing device 140 transmits data as it is or scrambled data when transmitting data to the data driving device 120 and the line polarity information may be information indicating the polarity of a first line of a pixel.

The data processing device 140 may carry out low-speed data communication using a second protocol signal PS2. The data processing device 140 may transmit a first protocol signal PS1 and a second protocol signal PS2 to the data driving device 120 through a first communication line LN1.

The data processing device 140 may transmit signals for optimizing the high-speed data communication to the data driving device 120 through the first communication line LN1. For example, the data processing device 140 may transmit a tuning signal for an equalizer of the data driving device 120 and the data driving device 120 may tune a gain of the equalizer to be optimized using such a tuning signal.

The data driving device 120 may feed a state of the data driving device 120 back to the data processing device 140 using an auxiliary communication signal ALP. The data driving device 120 may feed a clock training state for the low-speed data communication and a clock training state for the high-speed data communication back to the data processing device 140 using an auxiliary communication signal ALP. An auxiliary communication signal ALP regarding a clock training state for the low-speed data communication and a clock training state for the high-speed data communication may be referred to as a lock signal LOCK. The data driving device 120 may transmit a lock signal to the data processing device 140 through a second communication line LN2.

The data driving device 120 may feed a reception state of a signal through the first communication line LN1 back to the data processing device 140 using an auxiliary communication signal ALP. The data driving device 120 may send a feedback of a reception state of particular information, transferred by a first protocol signal PS1 and/or a second protocol signal PS2, using the auxiliary communication signal ALP. The data driving device 120 may generate status data about a reception state and include the status data in the auxiliary communication signal ALP to transmit it (to feed it back) to the data processing device 140.

According to an embodiment, a first protocol signal PS1 and a second protocol signal PS2 may be transmitted or received through a first communication line LN1 and an auxiliary communication signal ALP may be transmitted or received through a second communication line LN2. The first communication line LN1 may be an AC differential signal line and the second communication line LN2 may be a transistor-transistor line TTL or a single communication line comprising an open drain circuit.

The data processing device 140 and the data driving device 120 may perform 1:1 (one-to-one) communication through the first communication line LN1 or cascade communication in a form of a chain through the second communication line LN2.

For example, in a case when there are a plurality of data driving devices 120, the plurality of data driving devices 120 may be connected with each other in a form of a cascade by connecting adjacent data driving devices through the second communication line LN2 and at least one of the plurality of data driving devices may be connected with the data processing device 140 through the second communication line LN2.

The configuration of the first communication line LN1 and the second communication line LN2 will be described in detail below.

Figure 2:
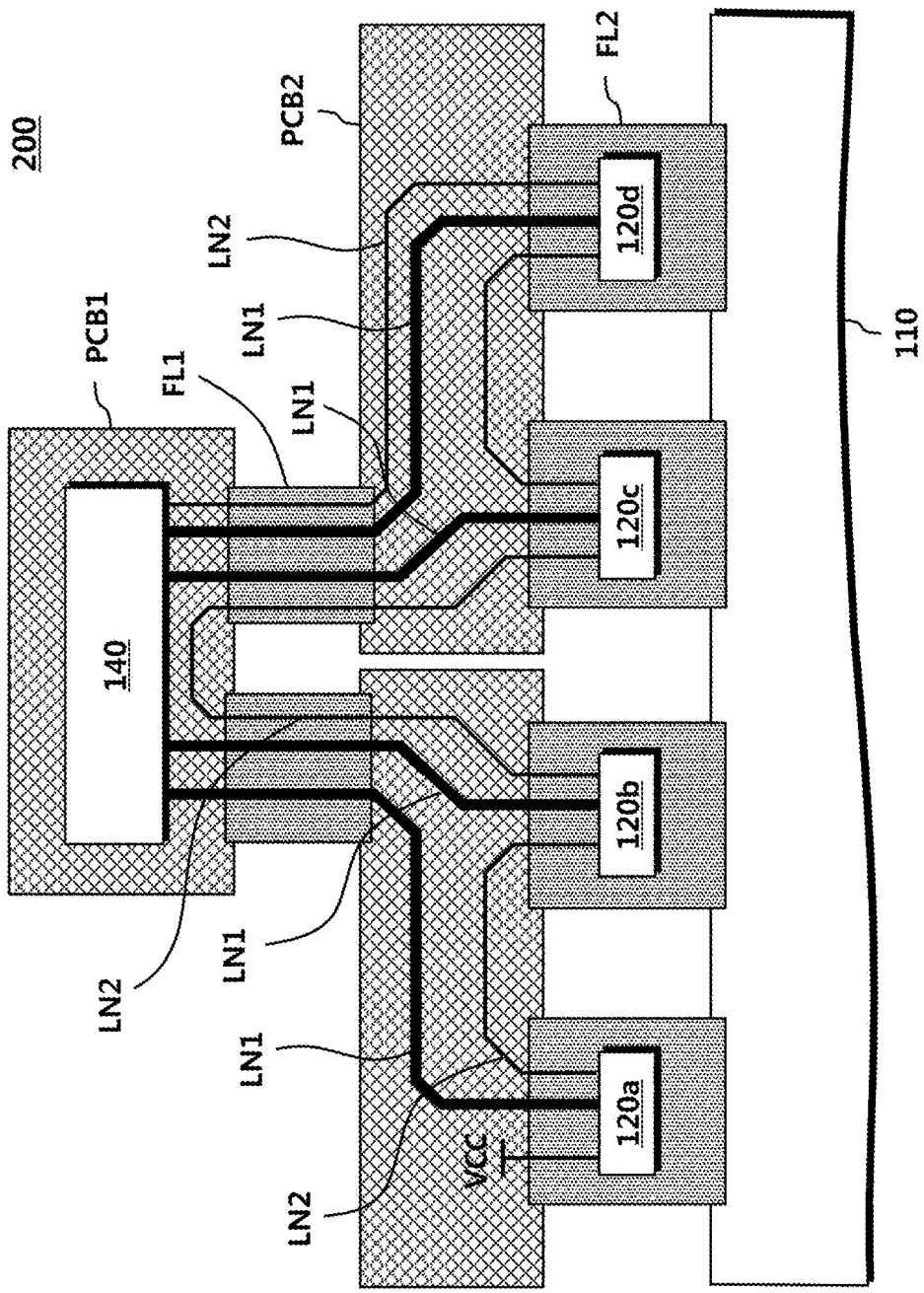
FIG. 2 is a configuration diagram of a system according to an embodiment.

FIG. 2 is a configuration diagram of a system according to an embodiment.

Referring to FIG. 2, a system may comprise at least one data processing device 140 and a plurality of data driving devices 120a, 120b, 120c, 120d.

The data processing device 140 may be disposed on a first printed circuit board PCB1. The data processing device 140 may be connected with the plurality of data driving devices 120a, 120b, 120c, 120d through first communication lines LN1 and second communication lines LN2.

The first communication lines LN1 and the second communication lines LN2 may reach the plurality of data driving devices 120a, 120b, 120c, 120d via the first printed circuit board PCB1 and second printed circuit boards PCB2. The first printed circuit board PCB1 and a second printed circuit board PCB2 may be connected with each other by a first film FL1 made of a flexible material and the first communication lines LN1 and the second communication lines LN2 may be extended from the first printed circuit board PCB1 to the second printed circuit boards PCB2 via the first films FL1.

Each of the data driving devices 120a, 120b, 120c, 120d may be disposed on a second film FL2 in a chip-on-film (COF) type. A second film FL2 may be a support substrate made of a flexible material connecting the second printed circuit boards PCB2 and the panel 110. The first communication lines LN1 and the second communication lines LN2 may be extended from the second printed circuit boards PCB2 to the respective data driving devices 120a, 120b, 120c, 120d via the second films FL2.

Each of the first communication lines LN1 may connect the data processing device 140 and each of the data driving devices 120a, 120b, 120c, 120d in 1:1.

Each of the second communication lines LN2, without overlapping with the first communication lines LN1, may connect the adjacent data driving devices 120a, 120b, 120c, 120d or a data driving device 120d and the data processing device 140. For example, a first data driving device 120a may be connected with a second data driving device 120b through a second communication line LN2 and the second data driving device 120b may be connected with a third data driving device 120c through a second communication line LN2. Here, the second data driving device 120b and the third data driving device 120c may respectively be connected with different second printed circuit boards PCB2. Accordingly, a second communication line LN2, disposed between the second data driving device 120b and the third data driving device 120c, may connect them via a second printed board PCB2, a first film FL1, the first printed board PCB1, a first film FL1, and a second printed board PCB2. The third data driving device 120c may be connected with a fourth data driving device 120d through a second communication line LN2 and the fourth data driving device 120d may be connected with the data processing device 140 through a second communication line LN2.

Figure 3:
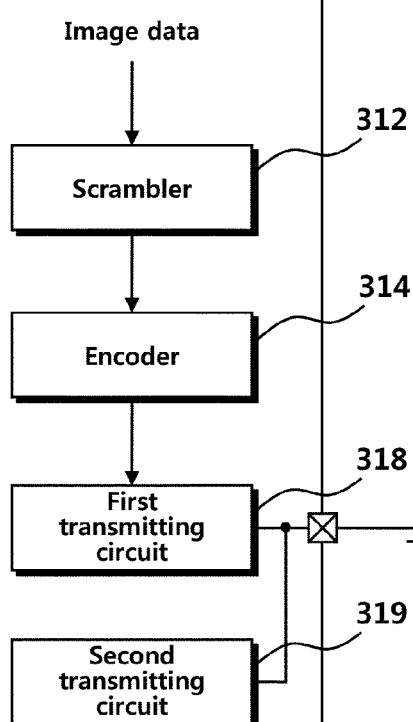
FIG. 3 is a diagram illustrating the processing of a first protocol signal in a data processing device and a data driving device according to an embodiment.
Figure 3:
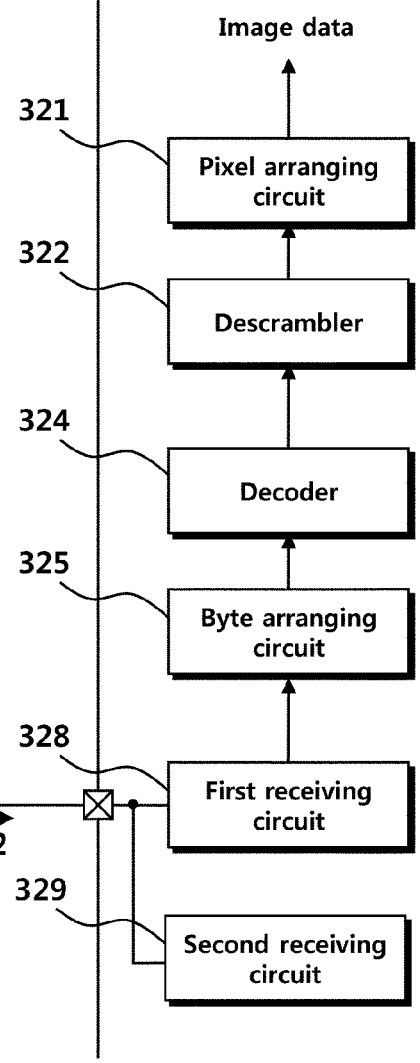

FIG. 3 is a diagram illustrating the processing of a first protocol signal in a data processing device and a data driving device according to an embodiment.

Referring to FIG. 3, the data processing device 140 may comprise a scrambler 312, an encoder 314, a first transmitting circuit 318, and a second transmitting circuit 319, and the data driving device 120 may comprise a first receiving circuit 328, a byte arranging circuit 325, a decoder 324, a descrambler 322, a pixel arranging circuit 321, and a second receiving circuit 329.

Data, for example image data, is scrambled by the scrambler 312. Scrambling is a process of jumbling bits of data to be transmitted. This allows preventing the same (for example 1 or 0) at least K (K is a natural number, which is 2 or higher) bits from being sequentially disposed in a transmission stream of data. The scrambling is carried out according to a previously prescribed protocol. The descrambler 322 of the data driving device 120 may restore data, in which bits in a stream are scrambled, to be in its original state.

The scrambler 312 may selectively scramble part of data of a first protocol signal PS1. For example, the scrambler 312 may scramble only a zero data part of a tuning signal for the equalizer ('equalizer tuning signal', hereinafter) and transmit it.

The encoder 314 may encode P bits in a transmission stream of data into Q bits. For example, P may be 8 and Q may be 10. Encoding data of 8 bits into data of 10 bits may be referred to as 8B10B encoding. The 8B10B encoding is a type of encoding method into a form of a DC balance code.

The encoder 314 may encode data such that its transmission stream comprises the increased number of bits. Encoded data may be decoded by the decoder 324 into a DC balance code, for example 8B10B. In another aspect, encoded data may be restored by the decoder 324 to have the original number of bits.

The encoder 314 may use a limited run length code (LRLC) method when encoding data. In one embodiment, "Run Length" means that the same bits are sequentially disposed, and according to the LRLC method, specific bits of data are controlled at intervals such that "Run Length" does not have a size greater than a predetermined one.

In a case when the encoder 314 encodes data using the LRLC method, the decoder 314 may decode data using the LRLC method used by the encoder 314.

Data transmitted in parallel in the data processing device 140 may be converted in series for transmission between the data processing device 140 and the data driving device 120. In the data processing device 140, a series-parallel conversion of data may be performed by a serialization circuit (620 in FIG. 5). A parallelization circuit 526 of the data driving device 120 may convert data received in series into data in parallel.

Data converted in series may be transmitted to the data driving device 120 by the first transmitting circuit 318 of the data processing device 140. Here, the data may be transmitted in a form of a first protocol signal PS1 through a first communication line LN1.

Date received by the data driving device 120 may be transmitted to the first receiving circuit 328, the byte arranging circuit 325, the decoder 324, the descrambler 322, and the pixel arranging circuit 321.

The first transmitting circuit 318 may transmit data through at least one first communication line LN1. Each first communication line LN1 may comprise two signal lines in order to transmit signals in a differential method. In a case when a plurality of first communication lines LN1 are used, the first transmitting circuit 318 may disperse data to transmit it through the plurality of first communication lines LN1. The first receiving circuit 328 may gather signals received in a dispersed state through the plurality of first communication lines LN1 to form data.

The data driving device 120 may train a link clock, for example a symbol clock or a pixel clock, according to link data included in a first protocol signal PS1. The byte arranging circuit 325 and the pixel arranging circuit 321 may arrange data by byte, for example by symbol, and by pixel according to a trained link clock.

The byte arranging circuit 325 may arrange data by byte. Byte, which is a basic unit to form information included in data, may, for example, be 8 bits or 10 bits. The byte arranging circuit 325 may arrange data transmitted in series such that it can be read by byte.

The pixel arranging circuit 321 may arrange data by pixel. Data may comprise sequentially arranged pieces of information corresponding to RGB sub-pixels or the like. The pixel arranging circuit 321 may arrange data transmitted in series such that it can be read by pixel.

When image data is arranged by pixel by the pixel arranging circuit 321, greyscale data—image data—for each sub-pixel may be generated.

The second transmitting circuit 319 of the data processing device 140 may transmit set data or the like to the data driving device 120 using a second protocol signal PS2. The data driving device 120 may receive the second protocol signal PS2 by the second receiving circuit 329 and check the set data or the like included in the second protocol signal PS2.

A first protocol signal PS1 and a second protocol signal PS2 may be transmitted and received through one same communication line (LN1 in FIG. 3). However, a first protocol signal PS1 and a second protocol signal PS2 may be transmitted respectively in differentiated times.

Figure 4:
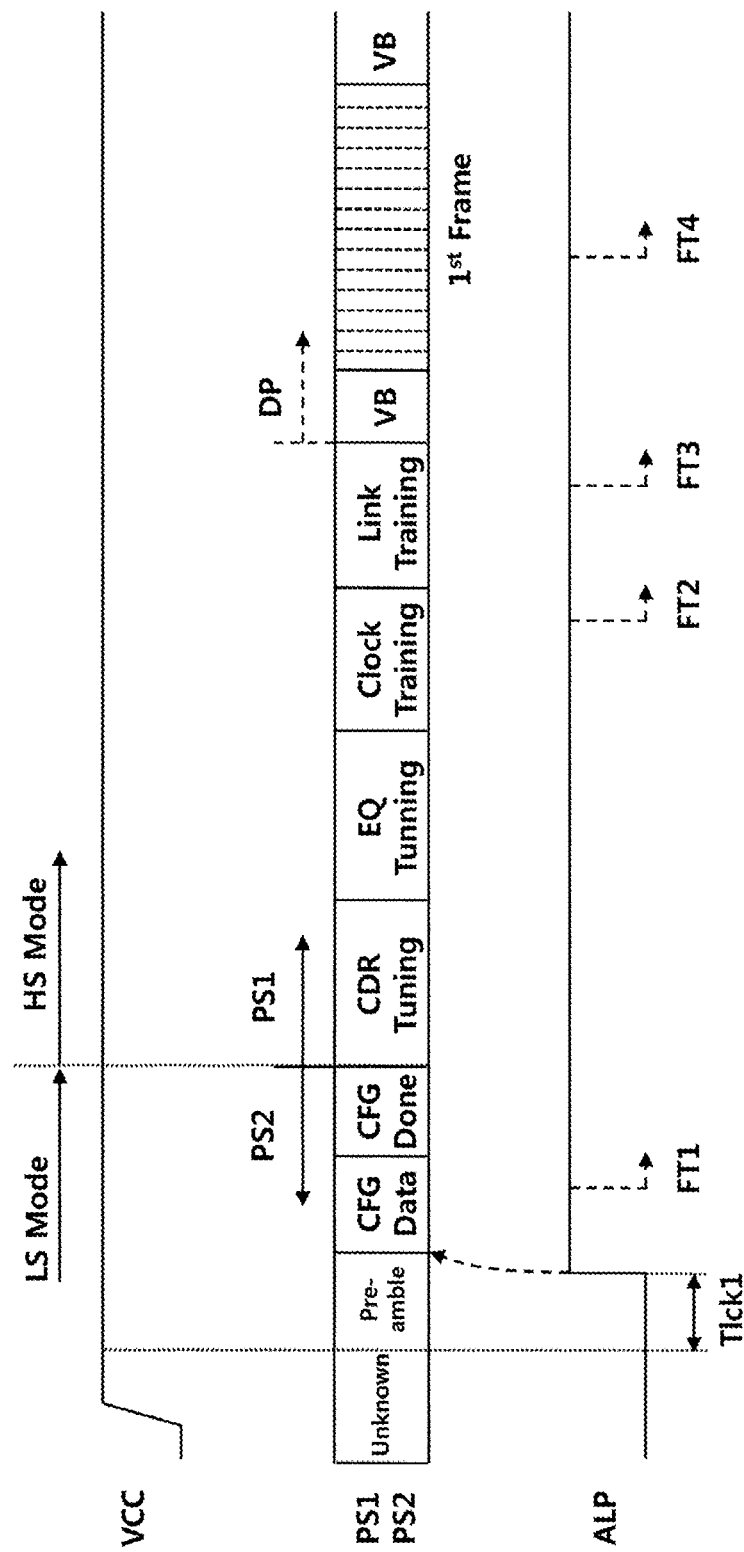
FIG. 4 is a diagram showing a general signal sequence between a data processing device and a data driving device according to an embodiment.

FIG. 4 is a diagram showing a general signal sequence between a data processing device and a data driving device according to an embodiment.

When a driving voltage VCC is supplied to the data processing device 140, the data processing device 140 may activate the low-speed communication mode LS Mode. Then, within a predetermined time, the data processing device 140 may transmit a second protocol signal PS2 to the data driving device 120.

In other words, the data processing device 140 and the data driving device 120 may perform the low-speed data communication through the first communication lines LN1.

After a lapse of a predetermined amount of time (for example, after a CFG Done section in FIG. 4), the data processing device 140 may activate the high-speed communication mode HS Mode and transmit a first protocol signal PS1 to the data driving device 120.

In other words, the data processing device 140 and the data driving device 120 may perform the high-speed data communication through the first communication lines LN1.

Here, a second protocol signal PS2, which is a signal based on a second protocol prescribed between the data processing device 140 and the data driving device 120, is a signal according to a low-speed data communication protocol, whereas a first protocol signal PS1, which is a signal based on a first protocol prescribed between the data processing device 140 and the data driving device 120, is a signal according to a high-speed data communication protocol.

A communication frequency of a first protocol signal PS1 may be 10 times higher than a communication frequency of a second protocol signal PS2. According to such a characteristic, a first protocol signal PS1 may be classified in a high-speed data communication protocol and a second protocol signal PS2 may be classified in a low-speed data protocol.

Meanwhile, in the high-speed data communication, a data loss rate may greatly vary or the communication may not be smoothly carried out depending on a setup of the data driving device 120 which is a receiving part.

According to an embodiment, before a high-speed data communication between the data processing device 140 and the data driving device 120 is carried out, setup data for carrying out a smooth high-speed data communication may be transmitted to the data driving device 120 using a second protocol signal PS2 corresponding to the low-speed data communication. The reason is that there is no great difference in data loss rates depending on a setup of the data driving device 120 in the low-speed data communication, and thus, the setup data may relatively exactly be transmitted to the data driving device 120.

According to an embodiment, sections where the data processing device 140 and the data driving device 120 transmit and receive second protocol signals PS2, that is, sections corresponding to the low-speed communication mode of the data processing device 140 and the data driving device 120 may be a Preamble section, a CFG Data section, and CFG Done section.

In the Preamble section, the data processing device 140 may transmit a low-speed communication clock signal, which is a second protocol signal PS2, to the data driving device 120. Here, in a case when an AC coupling capacitor is added to a first communication line LN1, the data processing device 140 may encode the low-speed communication clock signal into a form of a DC balance code such as a Manchester code or an 8B10B code.

The data driving device 120 may perform low-speed clock training using a low-speed communication clock signal and receive low-speed data using a trained low-speed communication clock.

In the CFG Data section, the data processing device 140 may transmit a setup data signal, which is a second protocol signal PS2, to the data driving device 120. In the CFG Data section, the data driving device 120 may receive the setup data signal using the aforementioned low-speed communication clock and set a circuit part for the high-speed data communication using setup data included in the setup data signal. Here, the setup data may comprise a basic gain level of the equalizer comprised in the data driving device 120, scramble information, and line polarity information. Additionally, the setup data may further comprise a plurality of pieces of equalizer (EQ) setup information used in an equalizer tuning section described below.

In the CFG Done section, a second protocol signal PS2 may comprise a message indicating the end of the low-speed communication mode. The data driving device 120 may check such a message and end communication using a second protocol signal PS2, that is, end the low-speed communication mode. Here, the message indicating the end of the low-speed communication mode may comprise a signal in which the level of a voltage is maintained high for a predetermined amount of time.

Meanwhile, a lock signal, which is an auxiliary communication signal ALP transmitted by the data driving device 120 to the data processing device 140 through a second communication line LN2, may be maintained at a second level after the data driving device 120 starts operating, and then, changed into a first level when low-speed clock training for a low-speed communication clock signal is completed.

In other words, the data driving device 120 may maintain a lock signal at the second level when a driving voltage VCC is supplied and change the level of the lock signal into the first level when low-speed clock training for a low-speed communication clock signal is completed in the Preamble section. The data processing device 140 may transmit a setup data signal including setup data to the data driving device 120 after the level of the lock signal has been changed into the first level. Here, the second level may be a low level (a low voltage level) and the first level may be a high level (a high voltage level).

In a case when there is any abnormal condition or any unexpected communication error in the data driving device 120 after changing the level of the lock signal into the first level, the data driving device 120 may change the level of the lock signal into the second level. For example, in a case when a setup data signal is not received or a clock is in an abnormal state in the CFG Data section or in the CFG Done section, the data driving device 120 may change the level of the lock signal to be low (see FT1 in FIG. 4).

Meanwhile, the data processing device 140 and the data driving device 120 may end the low-speed communication mode in the CFG Done section, and then, activate the high-speed communication mode and perform the high-speed communication using the first protocol signal PS1.

Here, sections corresponding to the high-speed communication mode may be a clock training section, a link training section, and a display section DP. One of a clock recovery circuit tuning section and an equalizer tuning section may further be added.

In the clock training section, a first protocol signal PS1 may comprise a high-speed communication clock signal.

In other words, the data driving device 120 may receive a high-speed communication clock signal from the data processing device 140 in the clock training section.

Additionally, the data driving device 120 may perform high-speed clock training using the high-speed communication clock signal and receive high-speed data using a trained high-speed communication clock.

In the link training section, the first protocol signal PS1 may comprise link data. The data driving device 120 may train a link clock, such as a symbol clock or a pixel clock, according to the link data.

In the display section DP, the first protocol signal PS1 may comprise image data and control data. The data driving device 120 may set parameters, required for driving a display, according to the control data and check a greyscale value for each pixel according to the image data to drive the pixel.

In a case when there is any abnormal condition or any unexpected communication error in the data driving device 120 in the high-speed communication mode, the data driving device 120 may change the level of the lock signal into the second level. For an example, the data driving device 120 may change the level of the lock signal into the second level in a case when high-speed clock training for a clock (a high-speed communication clock) is not completed (failed) in the clock training section (see FT2 in FIG. 4). For another example, the data driving device 120 may change the level of the auxiliary communication signal ALP to be low in a case when training for a link clock is failed in the link training section (see FT3 in FIG. 4). For still another example, the data driving device 120 may change the level of the lock signal into the second level in a case when the high-speed communication clock is in an abnormal status due to, for example, an electrostatic discharge (ESD) or there is any abnormal condition in the data driving device 120 (see FT4 in FIG. 4).

As described above, according to an embodiment, the data driving device may feed its status back to the data processing device using a lock signal, which is an auxiliary communication signal ALP, only when there is any abnormal condition or any unexpected communication error in the data driving device, not in every section. On the contrary, according to conventional arts, the data driving device feeds its status back to the data processing device using auxiliary communication signals in various sections. According to such a way, feedback signals are not well transferred to the data processing device, and thus, there is a problem in which a normal status is considered as an abnormal status. In particular, in a case when second communication lines LN2, through which auxiliary communication signals ALP are transmitted, are connected in a form of a cascade, it is more likely that such a problem occurs. However, according to an embodiment of the present disclosure, feedbacks using auxiliary communication signals ALP are simplified, and this decreases the probability of the occurrence of such a problem. This will be described below in detail.

Figure 5:
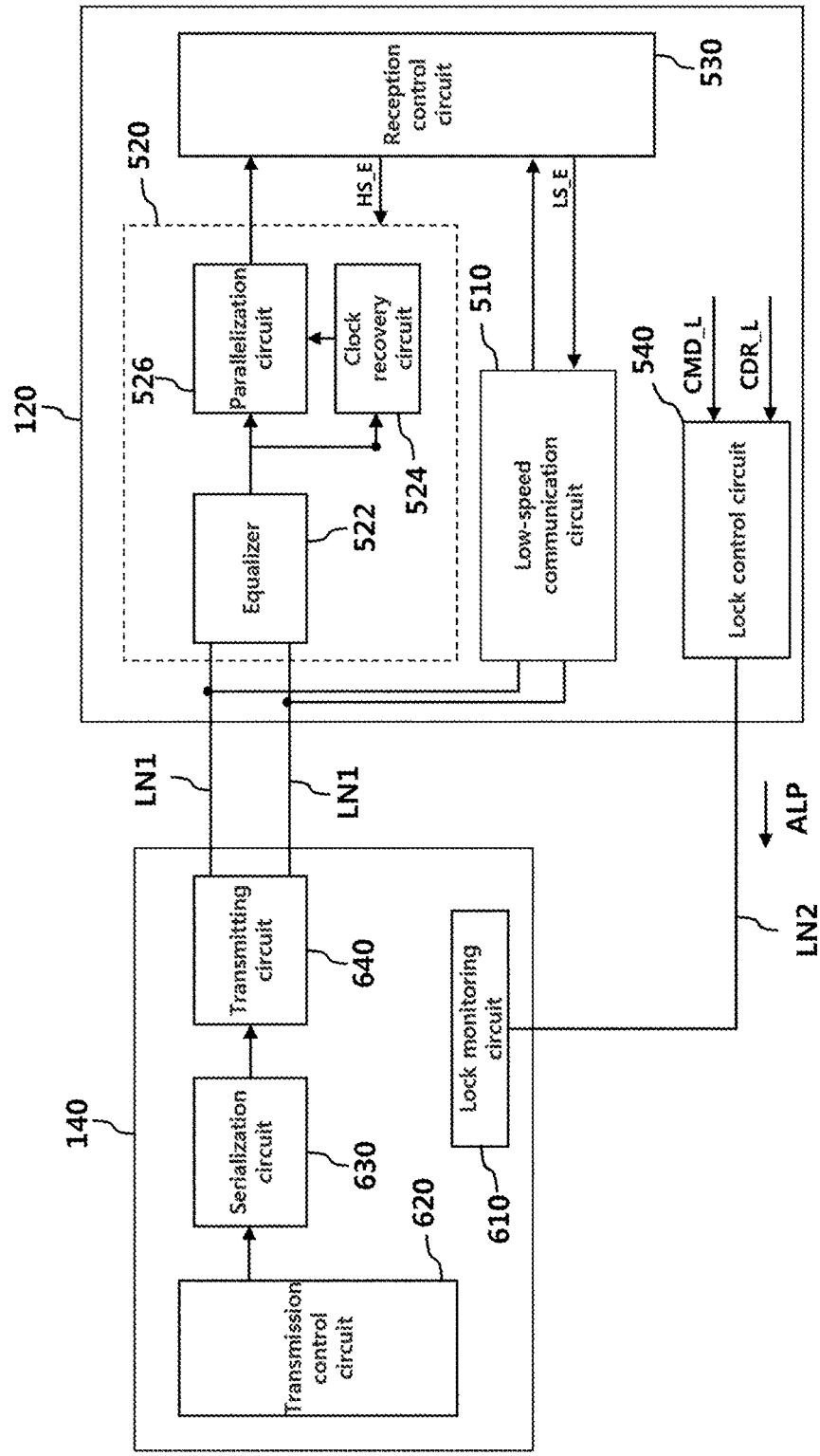
FIG. 5 is a diagram illustrating the processing of a second protocol signal in a data processing device and a data driving device according to an embodiment.

FIG. 5 is a diagram illustrating the processing of a second protocol signal in a data processing device and a data driving device according to an embodiment.

Referring to FIG. 5, the data driving device 120 may comprise a low-speed communication circuit 510, a high-speed communication circuit 520, a reception control circuit 530, and a lock control circuit 540.

The low-speed communication circuit 510 may perform low-speed data communication with the data processing device 140 through a first communication line LN1.

In other words, the low-speed communication circuit 510 may perform low-speed clock training using a low-speed communication clock signal received from the data processing device 140 in the low-speed communication mode and may output a first level of a low-speed communication status signal CMD_L to the lock control circuit 540 after completing the low-speed clock training.

In a case when the low-speed clock training is not completed (failed), the low-speed communication circuit 510 may output a second level of a low-speed communication status signal to the lock control circuit 540. The low-speed communication circuit 510 may receive a low-speed communication clock signal in the Preamble section shown in FIG. 4.

After completing the low-speed clock training, the low-speed communication circuit 510 may receive a setup data signal regarding a high-speed communication environment from the data processing device 140.

The low-speed communication circuit 510 may process (for example, signal decoding, data arrangement, or the like) the setup data signal into setup data and transfer the setup data to the reception control circuit 530. The low-speed communication circuit 510 may receive the setup data signal in the CFG Data section shown in FIG. 4.

In a case when there is any abnormality in the low-speed communication with the data processing device after the low-speed communication circuit 510 has completed the low-speed clock training, the low-speed communication circuit 510 may change the low-speed communication status signal from the first level into the second level and output it.

Then, the low-speed communication circuit 510 may re-receive the low-speed communication clock signal from the data processing device 140.

The low-speed communication circuit 510 may be activated by the control of the reception control circuit 530 when power is supplied to the data driving device 120. When the low-speed communication mode is ended in the CFG Done section shown in FIG. 4, the low-speed communication circuit 510 may be deactivated by the control of the reception control circuit 530.

The high-speed communication circuit 520 may be activated by the control of the reception control circuit 530 when the low-speed communication mode is ended and the high-speed communication mode HS Mode starts.

Then, the high-speed communication circuit 520 may perform high-speed communication with the data processing device 140 through the first communication lines LN1. In this way, the high-speed communication circuit 520 may receive image data signals from the data processing device 140. For example, the high-speed communication circuit 530 may receive image data signals in the display section DP shown in FIG. 4.

The high-speed communication circuit 520 may process an image data signal into image data.

The high-speed communication circuit 520 may comprise an equalizer 522, a clock recovery circuit 524, and a parallelization circuit 526.

The high-speed communication circuit 520 may receive a high-speed communication clock signal from the data processing device 140 before receiving an image data signal in the high-speed communication mode. The high-speed communication circuit 510 may receive the high-speed communication clock signal in the clock training section shown in FIG. 4.

The high-speed communication circuit 520 may perform high-speed clock training using the high-speed communication clock signal and adjust the level of a high-speed communication status signal CDR_L according to the result of the high-speed clock training to output it to the lock control circuit 540.

For example, when the high-speed communication circuit 520 completes the high-speed clock training, the high-speed communication circuit 520 may output a first level of the high-speed communication status signal. When the high-speed communication circuit 520 does not complete (fails) the high-speed clock training, the high-speed communication circuit 520 may output a second level of the high-speed communication status signal. Here, the high-speed communication status signal may be outputted from the clock recovery circuit 524.

In an embodiment, sections in the high-speed communication mode may be one or more of a clock recovery circuit tuning section CDR Tuning and an equalizer tuning section EQ Tuning before the clock training section.

The high-speed communication circuit 520 may receive a clock recovery circuit tuning signal from the data processing device 140 in the clock recovery circuit tuning section, which is before the clock training section.

Figure 6:
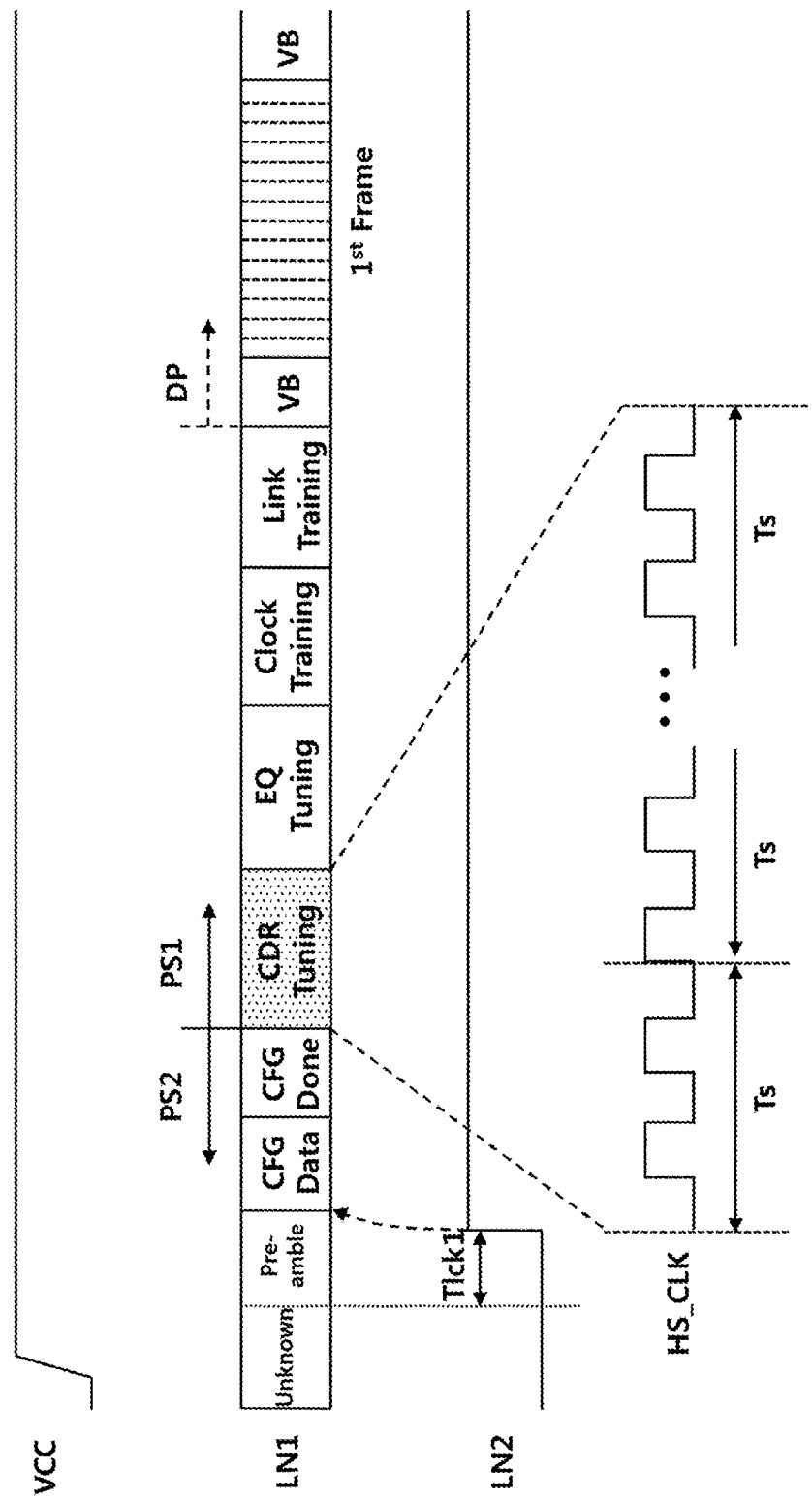
FIG. 6 and FIG. 7 are diagrams illustrating a clock recovery circuit tuning section, which is further included in a signal sequence before a clock training section according to an embodiment.

A clock recovery circuit tuning signal may comprise a high-speed communication clock as shown in FIG. 6. The clock recovery circuit 524 comprised in the high-speed communication circuit 520 may change set values of an oscillator every predetermined time Ts while performing the high-speed clock training.

Figure 7:
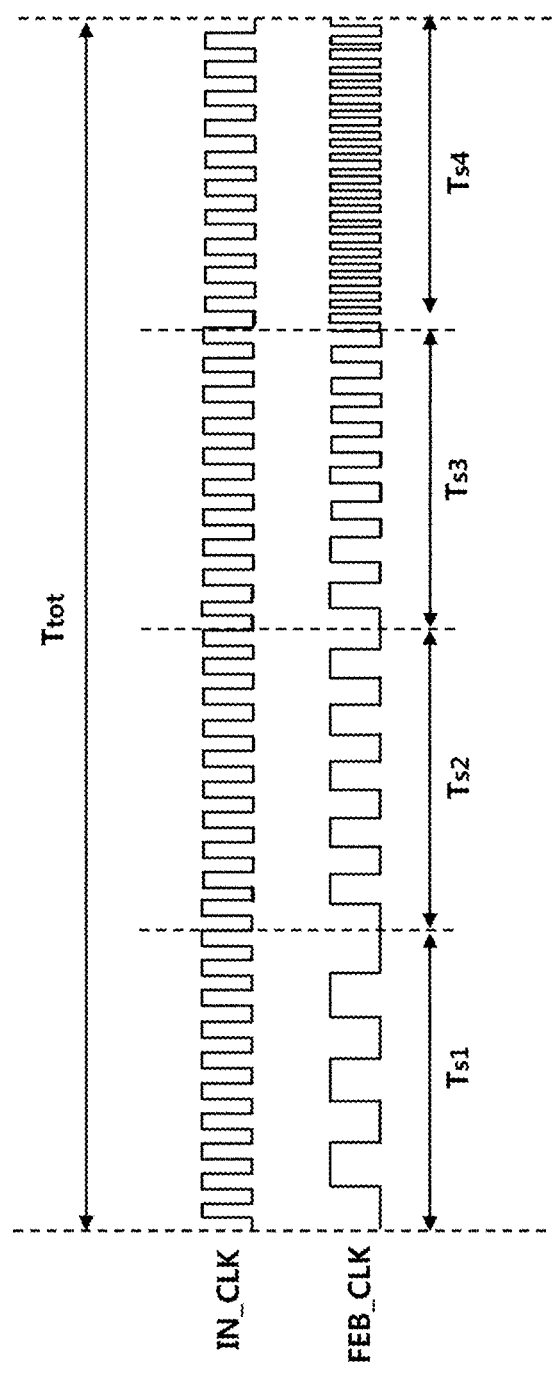

When the clock recovery circuit 524 changes set values of the oscillator every predetermined time Ts, the cycle of a feedback clock FEB_CLK used for the high-speed clock training as shown in FIG. 7, may be changed every predetermined time Ts. Here, a feedback clock may be obtained by multiplying the cycle of an oscillation clock outputted from the oscillator and a predetermined ratio.

The clock recovery circuit 524 may process a high-speed communication clock into an input clock IN_CLK, detect a phase difference between an input clock and a feedback clock every predetermined time Ts, determine a result of the high-speed clock training according to the phase difference, and adjust the level of a high-speed communication status signal at the first level or the second level depending on the result of the high-speed clock training. Here, an input clock IN_CLK may have a cycle obtained by multiplying the cycle of a high-speed communication clock and a predetermined ratio.

According to an embodiment, the oscillator comprised in the clock recovery circuit 524 may be any one of a current-controlled oscillator and a voltage-controlled oscillator, and a set value of the oscillator may comprise a current value of a reference current inputted into a current-controlled oscillator or a voltage value of a reference voltage inputted into a voltage-controlled oscillator.

The high-speed communication circuit 520 may receive an equalizer tuning signal from the data processing device 140 in the equalizer tuning section, which is before the clock training section.

Figure 8:
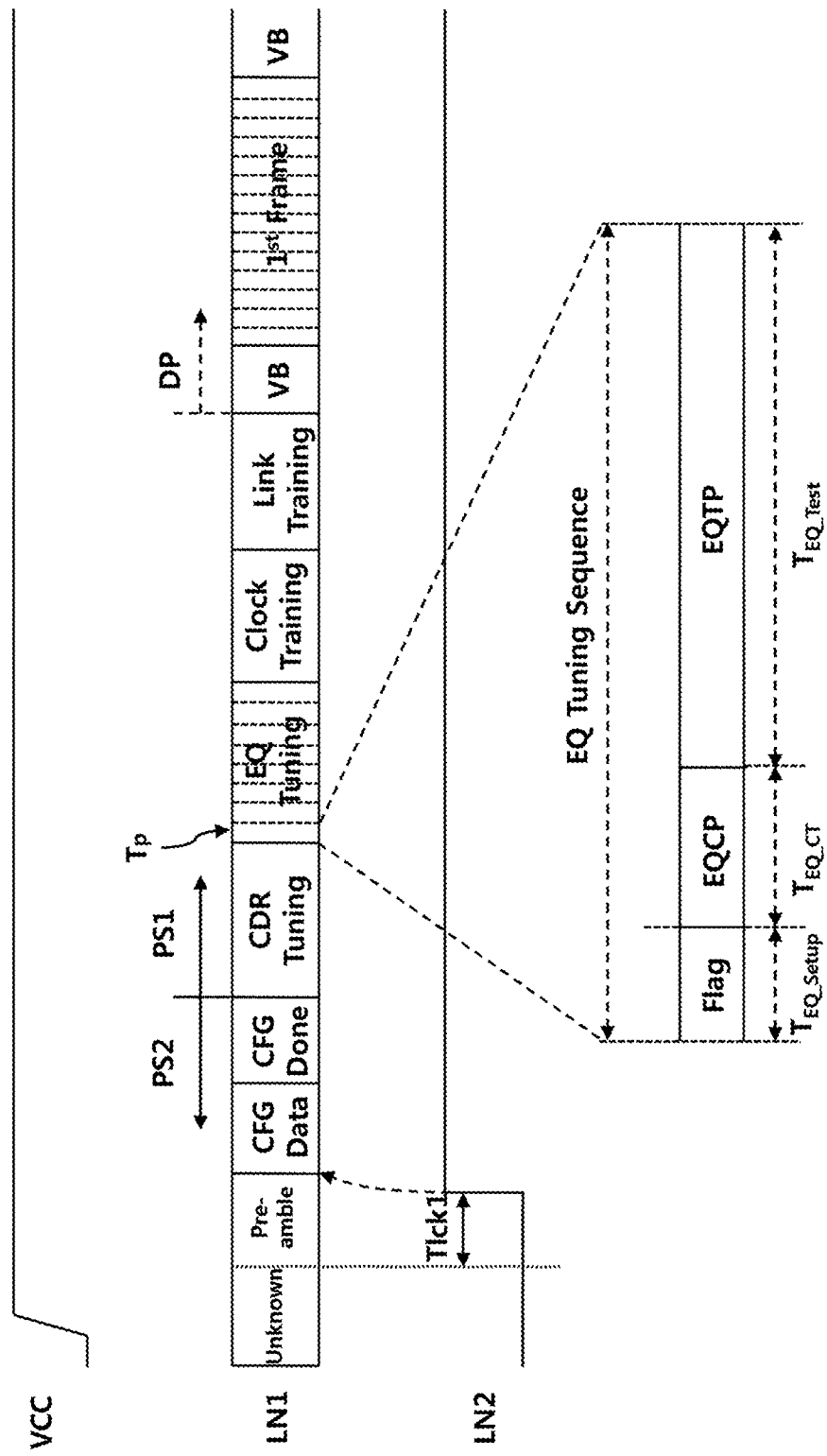
FIG. 8 is a diagram illustrating an equalizer tuning section, which is further included in a signal sequence before a clock training section according to an embodiment.

Here, an equalizer tuning signal may comprise tuning sequences repeated every time period Tp as shown in FIG. 8. A tuning sequence may comprise a flag signal Flag for indicating the division of time period, an EQ clock training signal EQCP disposed at the end of the flag signal, and an EQ test signal EQTP disposed at the end of the EQ clock training signal. Here, a communication frequency of an EQ clock training signal may be identical to a communication frequency of a high-speed communication clock signal.

Figure 9A:
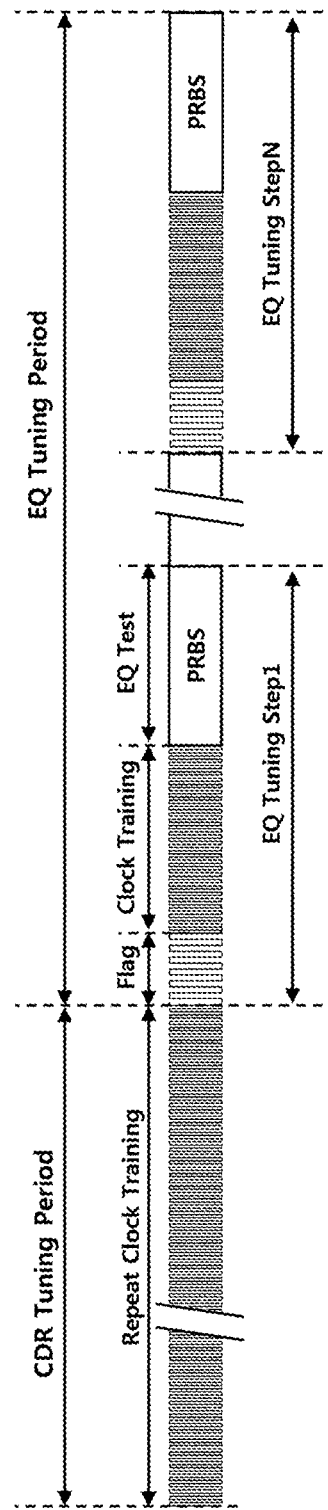
FIG. 9A and FIG. 9B are diagrams showing signal sequences in a clock recovery circuit tuning section and an equalizer tuning section.

In a case when an AC coupling capacitor (not shown) is added to a first communication line LN1 in FIG. 5, the flag signal may be a signal having a frequency lower than the communication frequency of an EQ clock training signal and in which a first level (for example, a high level) and a second level (for example, a low level) are alternated with each other as shown in FIG. 9A.

Figure 9B:
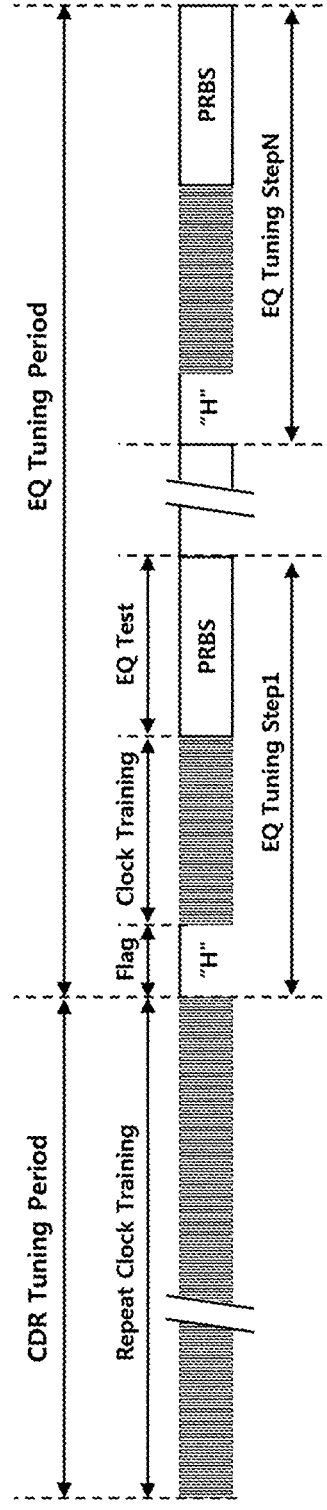

In a case when an AC coupling capacitor (not shown) is not added to a first communication line LN1 in FIG. 5, the flag signal may be a signal having a uniform level (for example, a high level) as shown in FIG. 9B.

An EQ test signal EQTP may comprise a pseudo random binary sequence (PRBS) pattern. A PRBS pattern may be realized as a PRBS7 pattern, PRBS9 pattern, PRBS10 pattern, or the like.

Or, an EQ test signal EQTP may comprise test data encoded in a DC balance code method. Test data encoded in a DC balance code method may comprise a plurality of code groups, in each of which the numbers of "0" and "1" are identical.

The high-speed communication circuit 520 may change the setup of the equalizer 522 in every time period according to a plurality of pieces of EQ setup information during a plurality of time periods when equalizer tuning signals are received. Here, the clock recovery circuit 524 of the high-speed communication circuit 520 may repeatedly perform, in every time period, an operation of initializing a clock, which has already been trained, when receiving a flag signal, and then, performing high-speed clock training using an EQ clock training signal.

Each of multiple pieces of EQ setup information may comprise a gain level of the equalizer 522 and may further comprise the number of tabs of the equalizer 522. Such multiple pieces of EQ setup information may be included in setup data and the reception control circuit 530 may extract the multiple pieces of EQ setup information from stored setup data.

According to an embodiment, the clock recovery circuit 524 of the high-speed communication circuit 520 may repeatedly perform the high-speed clock training in the clock recovery circuit tuning section and the equalizer tuning section.

Accordingly, the clock recovery circuit 524 may alternately output the first level and the second level of the high-speed communication status signals in the clock recovery circuit tuning section and the equalizer tuning section.

The reception control circuit 530 may control operations of the low-speed communication circuit 510 and the high-speed communication circuit 520.

In other words, the reception control circuit 530 may activate the low-speed communication circuit 510 by transferring enable information LS_E to the low-speed communication circuit 510 when power is applied to the data driving device 120.

In this way, low-speed data communication through the first communication lines LN1 may be carried out.

The reception control circuit 530 may set up a high-speed communication environment according to setup data transferred from the low-speed communication circuit 510. Here, the reception control circuit 530 may set up the equalizer 522 according to a basic gain level of the equalizer 522 included in the setup data.

Then, the reception control circuit 530 may activate the equalizer 522, the clock recovery circuit 524, and the parallelization circuit 526 by transferring enable information HS_E to the high-speed communication circuit 520.

In this way, high-speed data communication through the first communication lines LN1 may be carried out.

Here, the reception control circuit 530 may optimize the setup of the clock recovery circuit 524 by a tuning process of the clock recovery circuit 524 in the clock recovery circuit tuning section.

In other words, the reception control circuit 530 may check the result of the high-speed clock training of the clock recovery circuit 524 in every time period. Supposing that there are a plurality of time periods (for example, Ts1 to Ts4) as shown in FIG. 7 and in a case when, there is one time period where the clock recovery circuit 524 has completed the high-speed clock training, the reception control circuit 530 may tune the oscillator by a set value corresponding to this time period.

In a case when there are two or more time periods where the clock recovery circuit 524 has completed the high-speed clock training, the reception control circuit 530 may tune the oscillator by a median value of two or more set values corresponding to the two or more time periods.

The reception control circuit 530 may optimize the setup of the equalizer 522 by such a tuning process of the equalizer 522 in the equalizer tuning section.

In other words, the reception control circuit 530 may evaluate, in every time period, a reception performance of the high-speed communication circuit 520, which receives equalizer tuning signals in a plurality of time periods, then, tune the equalizer 522 using EQ setup information corresponding to a time period where the high-speed communication circuit 520 has the best reception performance.

Here, the reception control circuit 530 may calculate, in every time period, a bit error rate of an EQ test signal in relation to the PRBS pattern and tune the equalizer 522 using EQ setup information corresponding to a time period where the bit error rate is the lowest.

The reception control circuit 530 may check, in every time period, errors in test data included in EQ test signals, and tune the equalizer 522 using EQ setup information corresponding to a time period where the minimum errors occur.

According to an embodiment, the reception control circuit 530 may deactivate the low-speed communication circuit 510 by transferring disable information to the low-speed communication circuit 510 when transferring enable information HS_E to the high-speed communication circuit 520.

The lock control circuit 540 may generate a second level of a lock signal and transmit it to the lock monitoring circuit 640 in the data processing device 140 before the low-speed communication circuit 510 completes low-speed clock training, that is, before the lock control circuit 540 receives a first level of a low-speed communication status signal from the low-speed communication circuit 510.

When receiving a first level of a low-speed communication status signal from the low-speed communication circuit 510, the lock control circuit 540 may change the level of a lock signal into the first level and transmit it to the data processing device 140. Here, the level may mean the level of a voltage.

In a case when there is an abnormality in the low-speed data communication between the low-speed communication circuit 510 and the data processing device 140 after changing the level of a lock signal into the first level in the low-speed communication mode, the lock control circuit 540 may receive a second level of a low-speed communication status signal from the low-speed communication circuit 510. In this case, the lock control circuit 540 may change the level of a lock signal into the second level and transmit it to the data processing device 140.

As described above, in the low-speed communication mode, the lock control circuit 540 may change the level of a lock signal into the same level as that of a low-speed communication status signal.

Meanwhile, the lock control circuit 540 may maintain the level of a lock signal from the end of the low-speed communication mode to the clock training section.

The reason is that, in the high-speed communication mode, the lock control circuit 540 may receive high-speed communication status signals, of which the level alternately changes into the first level or the second level, from the clock recovery circuit 524 of the high-speed communication circuit 520 in the clock recovery circuit tuning section or the equalizer tuning section before the clock training section and if the lock control circuit 540 frequently changes the level of a lock signal according to the level of a high-speed communication status signal, the probability of the lock signal transmission error increases.

As an example, the clock recovery circuit 524 may change a set value of the oscillator every predetermined time while performing high-speed clock training in the clock recovery tuning section, which is before the clock training section. The clock recovery circuit 524 outputs the first level of a high-speed communication status signal when the high-speed clock training is completed and outputs the second level of a high-speed communication status signal when the high-speed clock training is not completed. However, the lock control circuit 540 may maintain the level of a lock signal at the first level regardless of the level of a high-speed communication status signal inputted from the clock recovery circuit 524.

As another example, the clock recovery circuit 524 may repeatedly perform multiple times the clock initialization and the high-speed clock training for the equalizer tuning in the equalizer tuning section, which is before the clock training section. The clock recovery circuit 524 outputs the second level of a high-speed communication status signal during the clock initialization and outputs the first level of a high-speed communication status signal when the high-speed clock training is completed. However, the lock control circuit 540 may maintain the level of a lock signal at the first level regardless of the level of a high-speed communication status signal inputted from the clock recovery circuit 524.

The lock control circuit 540 may maintain the level of a lock signal until the clock training section and change the level of the lock signal to be the same as that of a high-speed communication status signal after the clock training section.

Specifically, if the level of a high-speed communication status signal inputted into the lock control circuit 540 right after the clock training section is the first level, the lock control circuit 540 may maintain a lock signal at the first level. If the level of a high-speed communication status signal inputted into the lock control circuit 540 right after the clock training section is the second level, the lock control circuit 540 may change the level of a lock signal into the second level and transmit the lock signal to the data processing device 140.

Referring to FIG. 5, the data processing device 140 may comprise a lock monitoring circuit 610, a transmission control circuit 620, a serialization circuit 630, and a transmitting circuit 640.

The lock monitoring circuit 610 may receive a lock signal from the data driving device 120 and check the level of the lock signal. Here, the lock monitoring circuit 610 may receive the lock signal through a second communication line LN2.

According to an embodiment, in a case when a display device 100 comprises a plurality of data driving devices and second communication lines LN2 are connected in a cascade method, the number of data driving devices to be connected with the lock monitoring circuit 610 may be one.

When power is supplied to the data processing device 140, the transmission control circuit 620 may activate the low-speed communication mode.

Then, the transmission control circuit 620 may transmit a low-speed communication clock signal to the data driving device 120 using the transmitting circuit 640.

When the lock monitoring circuit 610 confirms that the level of a lock signal is changed from the second level to the first level during the transmission of a low-speed communication clock signal, the transmission control circuit 620 may transmit a setup data signal including setup data to the data driving device 120 using the transmitting circuit 640. Here, the low-speed communication clock signal and the setup data signal may be second protocol signals PS2. In a case when an AC coupling capacitor is added to a first communication line LN1, the transmission control circuit 620 may encode the low-speed communication clock signal and the setup data signal using a DC balance code, which may be any one of a Manchester code or an 8B10B code.

After the transmitting circuit 640 has transmitted the setup data signal, the transmission control circuit 620 may generate a second protocol signal PS2 including a message indicating the end of the low-speed communication mode and transmit the second protocol signal PS2 to the data driving device 120 using the transmitting circuit 640. In this way, the transmission control circuit 620 may end the low-speed communication mode.

When the lock monitoring circuit 610 confirms that the level of a lock signal is maintained at the first level, the transmission control circuit 620 may activate the high-speed communication mode and transmit a high-speed communication clock signal, which is a first protocol signal PS1, to the data driving device 120 using the transmitting circuit 640.

Specifically, when the lock monitoring circuit 610 confirms that the level of the lock signal is maintained at the first level from the time point when the level of the lock signal is changed into the first level until the transmitting circuit 640 has completed the transmission of a setup data signal, the transmission control circuit 620 may determine that the data driving device 120 is in normal condition.

In this case, the transmission control circuit 620 may activate the high-speed communication mode.

In addition, when the lock monitoring circuit 610 confirms that the level of a lock signal is maintained at the first level until a predetermined time has elapsed from the time point when the high-speed communication mode is activated, the transmission control circuit 620 may determine that the data driving device 120 is in normal condition.

In this case, the transmission control circuit 620 may generate a high-speed communication clock signal and transmit the high-speed communication clock signal to the data driving device 120 using the transmitting circuit 640.

In a case when a lock signal received and checked by the lock monitoring circuit 610 has the first level after the transmission of the high-speed communication clock signal, the transmission control circuit 620 may transmit a first protocol signal including image data and control data to the data driving device 120 using the transmitting circuit 640.

Meanwhile, according to an embodiment, the transmission control circuit 620 may generate one or more signals to make the high-speed clock training repeated in the data driving device 120 before transmitting a high-speed communication clock signal in the high-speed communication mode, and transmit the one or more signals to the data driving device 120 using the transmitting circuit 640. Here, the one or more signals may comprise a clock recovery circuit tuning signal and an equalizer tuning signal and the transmission control circuit 620 may start transmitting the signals using the transmitting circuit 640 right after the high-speed communication mode has been activated and end transmitting the signals when a predetermined amount of time has elapsed from the start.

When the transmitting circuit 640 transmits the one or more signals to the data driving circuit 120 for a predetermined amount of time, the data driving device 120 may transmit a lock signal fixed at the first level to the lock monitoring circuit 610.

Accordingly, when the lock monitoring circuit 610 confirms that the level of a lock signal is maintained at the first level until a predetermined amount of time has elapsed from the time point when the high-speed communication mode has been activated, the transmission control circuit 620 may determine that the data driving device 120 is in a normal condition.

In other words, in a case when the level of a lock signal is maintained at the first level from the start of transmitting the one or more signals to the end thereof, the transmission control circuit 620 may determine that the data driving device 120 is in a normal condition.

On the contrary, in a case when the lock monitoring circuit 610 does not receive any lock signal or a received lock signal does not have the first level until a predetermined amount of time has elapsed from the time point when the high-speed communication mode has been activated, the transmission control circuit 620 may determine that the data driving device 120 is in an abnormal condition.

In this case, the transmission control circuit 620 may re-activate the low-speed communication mode and transmit a low-speed communication clock signal and a setup data signal to the data driving device 120 using the transmitting circuit 640.

The serialization circuit 630 may convert a signal in a form of parallel data, among second protocol signals PS2 and first protocol signals PS1 generated by the transmission control circuit 620, into a signal in a form of serial data and transmit it to the transmitting circuit 640.

The transmitting circuit 640 may be connected with the data driving device 120 through the first communication lines LN1. Through this line, the transmitting circuit 640 may transmit a low-speed communication clock signal and a setup data signal to the data driving device 120 in the low-speed communication mode.

The transmitting circuit 640 may convert its mode into the high-speed communication mode (the low-speed data communication→the high-speed data communication) and transmit a high-speed communication clock signal to the data driving device 120.

After transmitting the high-speed communication clock signal, the transmitting circuit 640 may transmit a first protocol signal including image data and control data to the data driving device 120.

Meanwhile, before transmitting a high-speed communication clock signal, the transmitting circuit 640 may transmit one or more signals, to make the high-speed clock training repeated in the data driving device 120, to the data driving device 120.

The transmitting circuit 640 may comprise a first transmitting circuit and a second transmitting circuit as shown in FIG. 3.

As described above, according to an embodiment, the data processing device 140 may transmit one or more signals, in order to make the high-speed clock training repeated in the data driving device 120, to the data driving device 120 before transmitting a high-speed communication clock signal to the data driving device 120. Here, the one or more signals may be one or more of a clock recovery circuit tuning signal and an equalizer tuning signal for optimizing the high-speed communication environment of the data driving device 120.

The data driving device 120 may perform the high-speed clock training multiple times using the clock recovery circuit tuning signal and transmit a lock signal fixed at the first level, regardless of the multiple times of high-speed clock trainings, to the data processing device 140.

In addition, the data driving device 120 may perform the high-speed clock training multiple times using the equalizer tuning signal and transmit a lock signal fixed at the first level, regardless of the multiple times of high-speed clock trainings, to the data processing device 140.

In a case when the data driving device 120 continuously transmits the first level of lock signals, the data processing device 140 may determine, according to a predetermined protocol, that the data driving device 120 is in a normal condition. Accordingly, the data processing device 140 may precisely determine the status of the data driving device 120 even when the data driving device 120 repeats the high-speed clock training for optimizing the high-speed communication environment, and this allows a smooth high-speed data communication between the data processing device 140 and the data driving device 120.

What is claimed is:

1. A data driving device comprising:
a low-speed communication circuit to perform low-speed clock training, using a low-speed communication clock signal received from a data processing device in a low-speed communication mode, and to output a first level of a low-speed communication status signal after completing the low-speed clock training;
a high-speed communication circuit to perform high-speed clock training, using a high-speed communication clock signal received from the data processing device in a clock training section in a high-speed communication mode using a higher communication frequency than the low-speed communication mode, and to output a high-speed communication status signal after adjusting a level of the high-speed communication status signal according to a result of the high-speed clock training; and
a lock control circuit to generate a lock signal according to the low-speed communication status signal and the high-speed communication status signal to transmit the lock signal to the data processing device and to maintain a level of the lock signal from an end of the low-speed communication mode to the clock training section in the high-speed communication mode,
wherein the low-speed communication circuit receives data for setting a circuit part for the high-speed communication in the low-speed communication mode and the high-speed communication circuit is activated after the low-speed communication mode has been completed.

2. The data driving device of claim 1, wherein the lock control circuit transmits a second level of the lock signal before the low-speed communication circuit completes the low-speed clock training, changes the level of the lock signal into a first level to transmit the lock signal to the data processing device when the low-speed communication status signal, received from the low-speed communication circuit, is at a first level, and transmits the lock signal fixed at the first level from the end of the low-speed communication mode to the clock training section.

3. The data driving device of claim 1, wherein the lock control circuit generates the lock signal according to the low-speed communication status signal in the low-speed communication mode and according to the high-speed communication status signal after the clock training section in the high-speed communication mode.

4. The data driving device of claim 1, wherein the high-speed communication circuit comprises a clock recovery circuit and an equalizer, the clock recovery circuit performs high-speed clock training, and then, the high-speed communication status signal is outputted to the lock control circuit.

5. The data driving device of claim 4, wherein, in an equalizer tuning section before the clock training section, the clock recovery circuit repeatedly performs multiple times a clock initialization and high-speed clock training for equalizer tuning, wherein the clock recovery circuit outputs a second level of the high-speed communication status signal during the clock initialization and outputs a first level of the high-speed communication status signal when the high-speed clock training is completed.

6. The data driving device of claim 5, wherein, in the equalizer tuning section, the lock control circuit transmits the lock signal, fixed at the first level regardless of a change of the level of the high-speed communication status signal received from the clock recovery circuit, to the data processing device.

7. The data driving device of claim 4, wherein the clock recovery circuit comprises an oscillator, and, in a clock recovery circuit tuning section before the clock training section, the clock recovery circuit changes a set value for the oscillator every predetermined time while performing high-speed clock training, outputs a first level of the high-speed communication status signal when the high-speed clock training is completed, and outputs a second level of the high-speed communication status signal when the high-speed clock training is not completed.

8. The data driving device of claim 7, wherein the lock control circuit transmits the lock signal, fixed at the first level regardless of a change of the level of the high-speed communication status signal received from the clock recovery circuit, to the data processing device.

9. The data driving device of claim 7, wherein the oscillator is one of a current-controlled oscillator and a voltage-controlled oscillator and the set value comprises a current value of a reference current inputted to the current-controlled oscillator or a voltage value of a reference voltage inputted to the voltage-controlled oscillator.

10. The data driving device of claim 1, wherein, in the low-speed communication mode, in a case when there is any abnormality in low-speed communication with the data processing device after the low-speed communication circuit has outputted the first level of the low-speed communication status signal, the low-speed communication circuit changes the level of the low-speed communication status signal from the first level into a second level and output the signal, and the lock control circuit changes the level of the lock signal into a second level and transmit lock signal to the data processing device.

11. The data driving device of claim 1, wherein, when the high-speed communication status signal, inputted into the lock control circuit right after the clock training section, has the first level, the lock control circuit maintains the level of a lock signal at a first level, and when the high-speed communication status signal, inputted into the lock control circuit right after the clock training section, has a second level, the lock control circuit changes the level of the lock signal into a second level and transmit the lock signal to the data processing device.

12. A data processing device comprising:
a lock monitoring circuit to receive a lock signal from a data driving device and to check a level of the lock signal;
a transmitting circuit to transmit a low-speed communication clock signal and a setup data signal to a low-speed communication circuit of the data driving device in a low-speed communication mode, and to transmit a high-speed communication clock signal to a high-speed communication circuit of the data driving device after changing from the low-speed communication mode into a high-speed communication mode using a higher communication frequency than the low-speed communication mode, wherein the setup data signal comprises data to set a circuit part for high-speed communication in the data driving device;
a control circuit to activate the low-speed communication mode to transmit the low-speed communication clock signal using the transmitting circuit when power is supplied, to transmit the setup data signal using the transmitting circuit after the lock monitoring circuit confirms that the level of the lock signal is changed from a second level into a first level when the transmitting circuit transmits the low-speed communication clock signal, and to activate the high-speed communication mode to transmit the high-speed communication clock signal using the transmitting circuit when the lock monitoring circuit confirms that a level of the lock signal is maintained at the first level,
wherein the high-speed communication circuit of the data driving device is activated based on the setup data signal received by the low-speed communication circuit of the data driving device in the low-speed communication mode.

13. The data processing device of claim 12, wherein, in the high-speed communication mode, the control circuit transmits one or more signals, to make high-speed clock training repeated in the data driving device, to the data driving device using the transmitting circuit before transmitting the high-speed communication clock signal using the transmitting circuit.

14. The data processing device of claim 13, wherein, when the lock monitoring circuit confirms that the level of the lock signal is maintained at the first level from a start to an end of a transmission of the one or more signals, the control circuit transmits the high-speed communication clock signal using the transmitting circuit.

15. The data processing device of claim 12, wherein, when the lock monitoring circuit confirms that the level of the lock signal is maintained at the first level from a time point when the level of the lock signal is changed into the first level to a time point when the transmitting circuit completes a transmission of the setup data signal, the control circuit activates the high-speed communication mode, and when the lock monitoring circuit confirms that the level of the lock signal is maintained at the first level until a predetermined amount of time has elapsed from a time point when the high-speed communication mode is activated, the control circuit transmits the high-speed communication clock signal using the transmitting circuit.

16. A system comprising:
a data processing device to activate a low-speed communication mode to transmit a low-speed communication clock signal when power is supplied and transmit a setup data signal in the low-speed communication mode, wherein the data processing device transmits the setup data signal when receiving a first level of a lock signal while transmitting the low-speed communication clock signal, and activate a high-speed communication mode, using a higher communication frequency than the low-speed communication mode, to transmit a high-speed communication clock signal when continuously receiving the first level of the lock signal; and
a data driving device to:
receive the low-speed communication clock signal to perform low-speed clock training by a low-speed communication circuit;
transmit the first level of the lock signal to the data processing device when the low-speed clock training is completed; and
receive the high-speed communication clock signal to perform high-speed clock training by a high-speed communication circuit, wherein the data driving device maintains the first level of the lock signal from a reception of the setup data signal in the low-speed communication mode to a performance of the high-speed clock training,
wherein the setup data signal comprises data to set a circuit part for a high-speed communication in the data driving device, and the high-speed communication circuit is activated based on the setup data signal received by the low-speed communication circuit in the low-speed communication mode.

17. The system of claim 16, wherein the data driving device comprises a clock recovery circuit and an equalizer and the data processing device transmits one or more of a clock recovery circuit tuning signal and an equalizer tuning signal to the data driving device before transmitting the high-speed communication clock signal in the high-speed communication mode.

18. The system of claim 17, wherein the clock recovery circuit tuning signal comprises a high-speed communication clock, and the data driving device performs high-speed clock training multiple times when tuning the clock recovery circuit using the clock recovery circuit tuning signal, wherein the data driving device transmits the lock signal, fixed at the first level regardless of the multiple times of high-speed clock trainings, to the data processing device.

19. The system of claim 17, wherein the equalizer tuning signal comprises a high-speed communication clock, and the data driving device performs high-speed clock training multiple times when tuning the equalizer using the equalizer tuning signal, wherein the data driving device transmits the lock signal, fixed at the first level regardless of the multiple times of high-speed clock trainings, to the data processing device.

* * * * *